(12) United States Patent
de Blok et al.

(10) Patent No.: US 7,239,714 B2
(45) Date of Patent: Jul. 3, 2007

(54) MICROPHONE HAVING A FLEXIBLE PRINTED CIRCUIT BOARD FOR MOUNTING COMPONENTS

(75) Inventors: Marcel de Blok, Amsterdam (NL); Adrianus M. Lafort, Delft (NL); Dion I. de Roo, Voorburg (NL)

(73) Assignee: Sonion Nederland B.V., Amsterdam (NL)

( * ) Notice: Subject to any disclaimer, the term of this patent is extended or adjusted under 35 U.S.C. 154(b) by 500 days.

(21) Appl. No.: 10/265,979

(22) Filed: Oct. 7, 2002

(65) Prior Publication Data
US 2003/0068059 A1  Apr. 10, 2003

Related U.S. Application Data

(60) Provisional application No. 60/327,806, filed on Oct. 9, 2001.

(51) Int. Cl.
*H04R 9/08* (2006.01)
*H04R 25/00* (2006.01)

(52) U.S. Cl. .................. 381/369; 381/174
(58) Field of Classification Search ............. 381/113, 381/116, 174, 176, 178, 190, 191, 355, 361, 381/365, 369
See application file for complete search history.

(56) References Cited

U.S. PATENT DOCUMENTS

| | | | |
|---|---|---|---|
| 2,490,236 A | 12/1949 | Shaper | 171/327 |
| 3,068,446 A | 12/1962 | Ehrlich et al. | 340/8 |
| 4,063,049 A | 12/1977 | Pipitone et al. | 179/110 A |
| 4,550,227 A | 10/1985 | Topholm | 179/107 E |
| 4,607,720 A | 8/1986 | Hardt | 181/135 |
| 4,621,171 A * | 11/1986 | Wada et al. | 381/113 |
| 4,634,815 A | 1/1987 | Marquis | 387/68.4 |

(Continued)

FOREIGN PATENT DOCUMENTS

EP      0499 237      2/1992

(Continued)

OTHER PUBLICATIONS

Microtronic, Product News and drawing for "Cylindrical Microphone Series 8000," 2 pages (Apr. 19, 2001).

(Continued)

*Primary Examiner*—Sinh Tran
*Assistant Examiner*—Brian Ensey
(74) *Attorney, Agent, or Firm*—Nixon Peabody LLP

(57) ABSTRACT

In a microphone cartridge, a flexible printed circuit board serves two functions, separating the diaphragm and backplate, and electrically connecting the cartridge and the buffer amplifier. The flex-print includes a spacer portion that maintains the appropriate distance between the diaphragm and backplate, and an integral lead portion having a conductor serving as the signal path for transmitting the signal from the cartridge to the amplifier. The spacer portion has a conductor that electrically contacts the diaphragm or backplate and is connected to the conductor of the integral lead portion. The integral lead portion may optionally include a second electrical conductor providing a reference path from the cartridge to the amplifier. Further, the flex-print may be used as the carrier for the amplifier, its associated circuitry, and for other circuitry within the listening device. And, the flex-print may be used as a portion of the diaphragm subassembly and/or the backplate subassembly 54 Claims, 13 Drawing Sheets

U.S. PATENT DOCUMENTS

| | | | |
|---|---|---|---|
| 4,736,430 A | 4/1988 | Schröder | 381/68.6 |
| 4,739,512 A | 4/1988 | Hartl et al. | 381/68.6 |
| 4,764,690 A | 8/1988 | Murphy et al. | 307/400 |
| 4,850,023 A | 7/1989 | Yarush | 381/67 |
| 4,852,177 A | 7/1989 | Ambrose | 381/154 |
| 4,903,308 A | 2/1990 | Paddock et al. | 381/202 |
| 4,993,072 A | 2/1991 | Murphy | 381/113 |
| 5,048,090 A | 9/1991 | Geers | 381/68.6 |
| 5,097,515 A | 3/1992 | Baba | 381/191 |
| 5,204,917 A * | 4/1993 | Arndt et al. | 381/324 |
| 5,220,612 A | 6/1993 | Tibbetts et al. | 381/68 |
| 5,335,286 A | 8/1994 | Carlson et al. | 381/191 |
| 5,373,555 A | 12/1994 | Norris et al. | 379/430 |
| 5,408,534 A | 4/1995 | Lenzini et al. | 381/191 |
| 5,530,763 A | 6/1996 | Aebi et al. | 381/69 |
| 5,548,658 A | 8/1996 | Ring et al. | 381/191 |
| 5,570,428 A | 10/1996 | Madaffari et al. | 381/191 |
| 5,740,261 A | 4/1998 | Loeppert et al. | 381/168 |
| 5,828,766 A | 10/1998 | Gallo | 381/190 |
| 5,859,916 A | 1/1999 | Ball et al. | 381/326 |
| 5,881,158 A | 3/1999 | Lesinski et al. | 381/174 |
| 6,075,869 A | 6/2000 | Killion et al. | 381/313 |
| 6,324,907 B1 * | 12/2001 | Halteren et al. | 73/431 |
| 6,456,720 B1 * | 9/2002 | Brimhall et al. | 381/324 |
| 2003/0168945 A1 * | 9/2003 | Birgel | 310/366 |

FOREIGN PATENT DOCUMENTS

| | | | |
|---|---|---|---|
| JP | 57-025797 | * | 2/1982 |
| JP | 11266499 A | | 9/1999 |
| JP | 2000050394 A | | 2/2000 |
| WO | WO 00/41432 A2 | | 7/2000 |
| WO | WO 01/43489 A2 | | 6/2001 |
| WO | WO 01/95667 A1 * | | 12/2001 |

OTHER PUBLICATIONS

European Search Report for European Application No. EP 02 07 9187 dated Jul. 17, 2006 (3 pages).

* cited by examiner

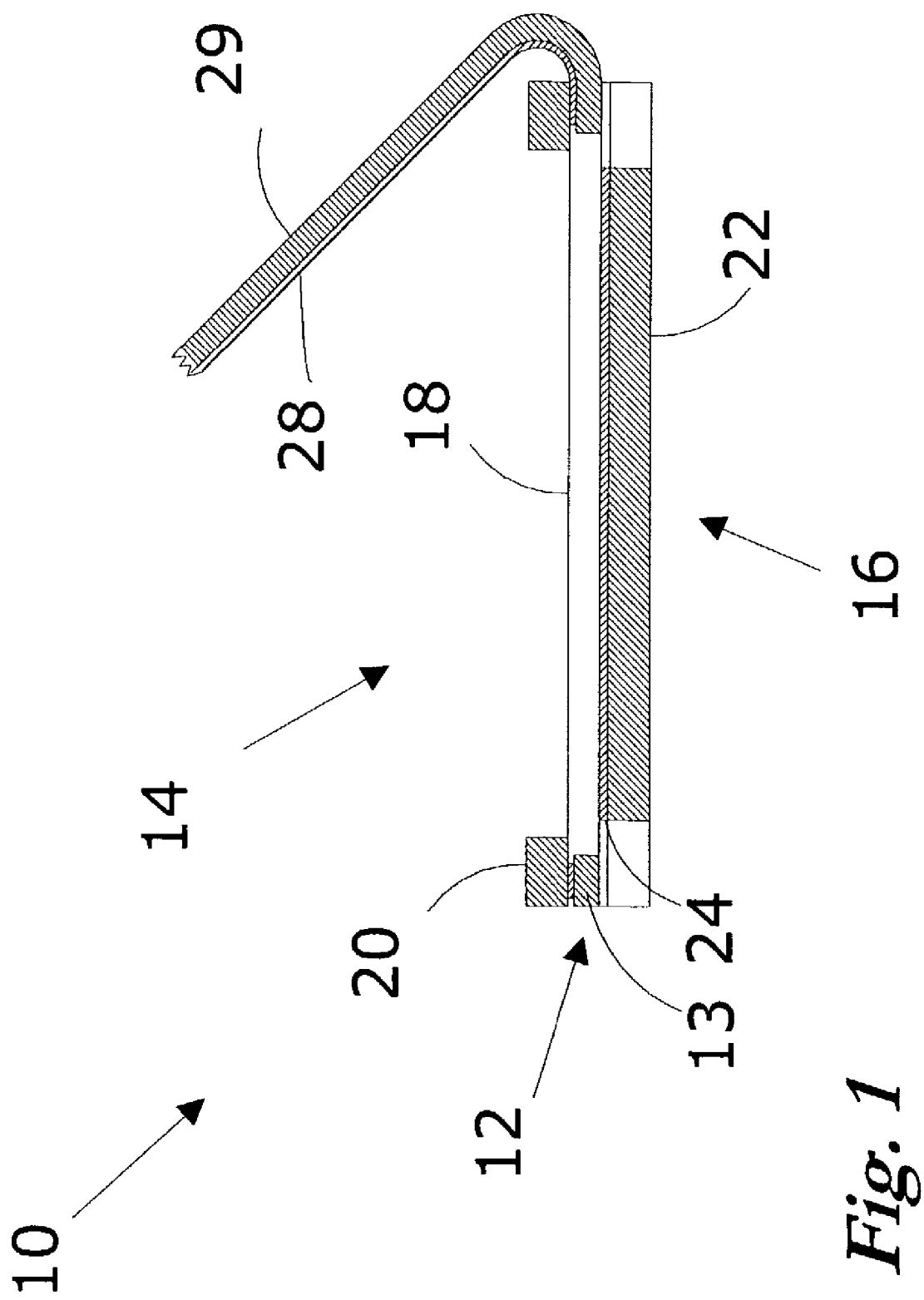

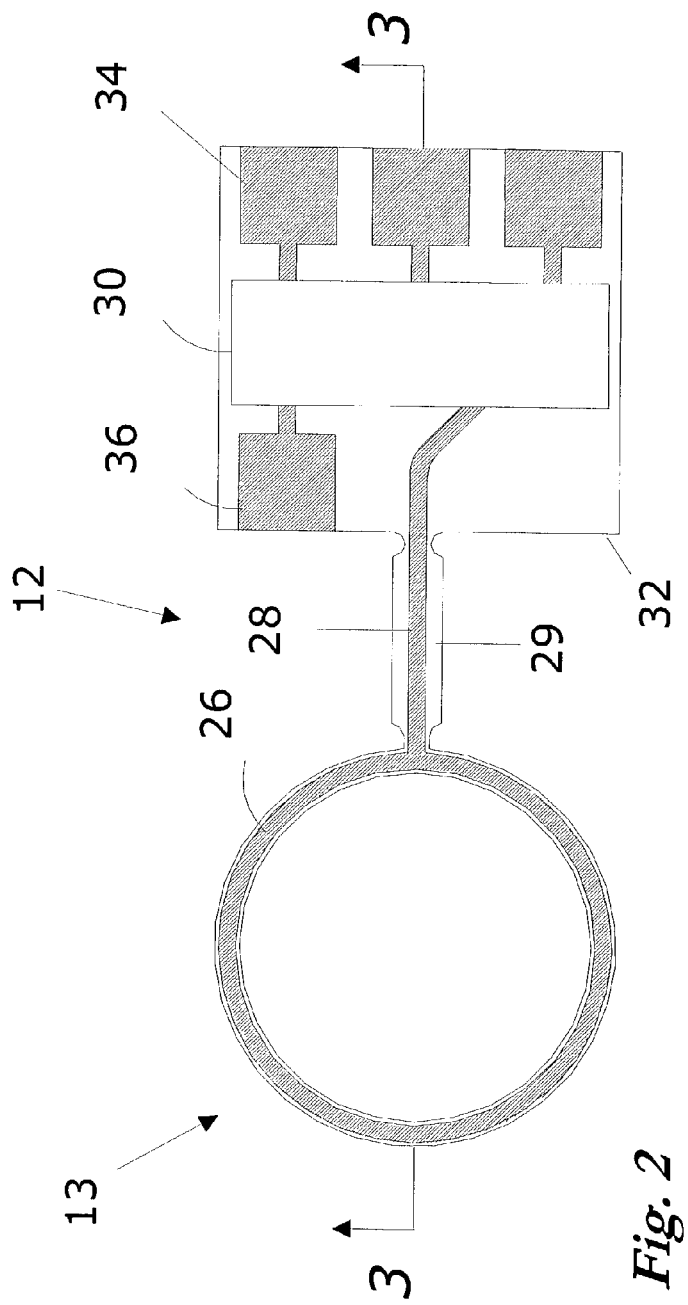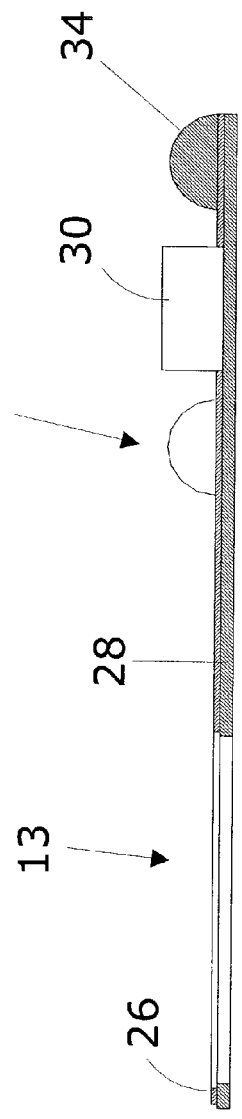

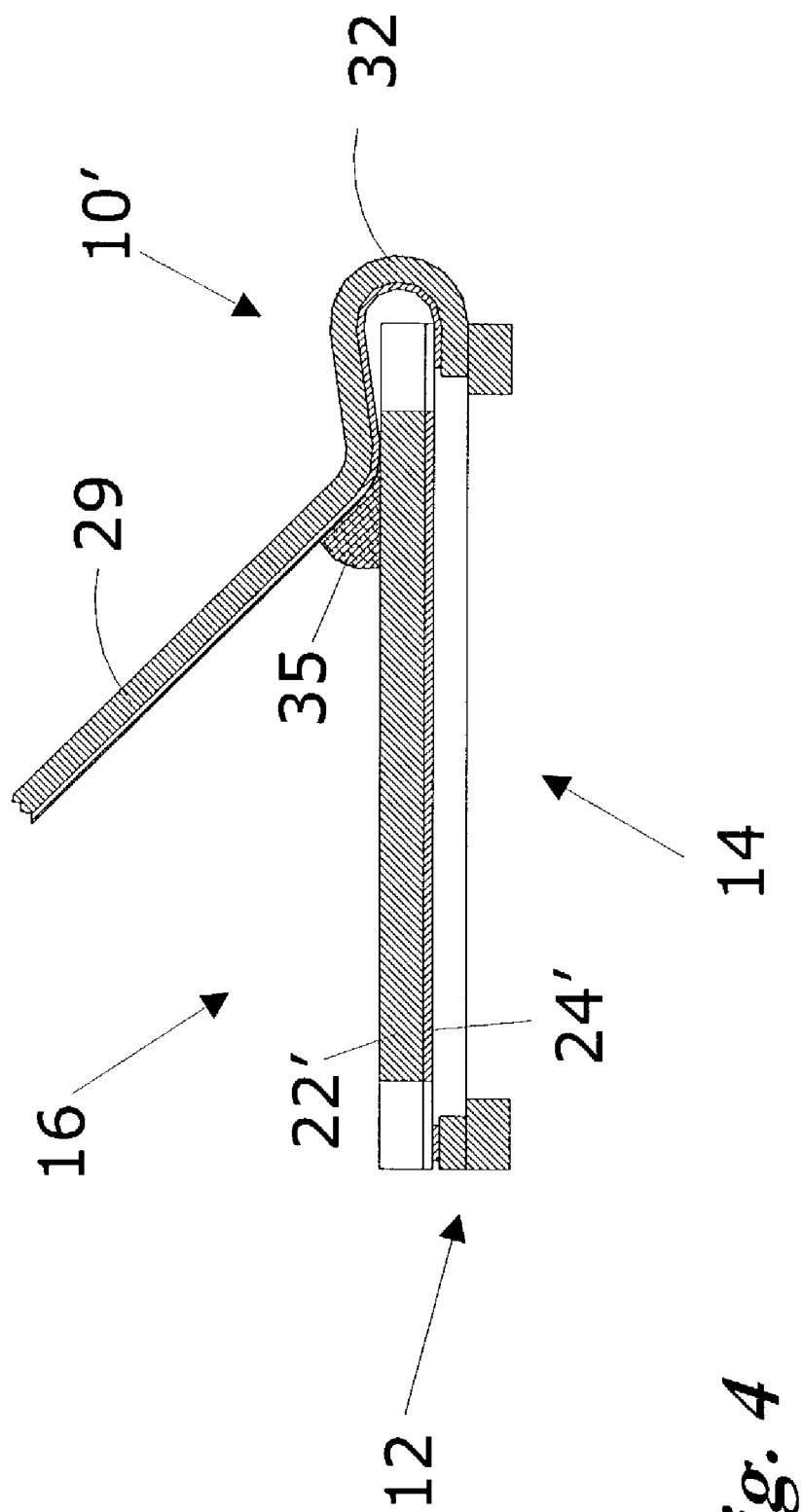

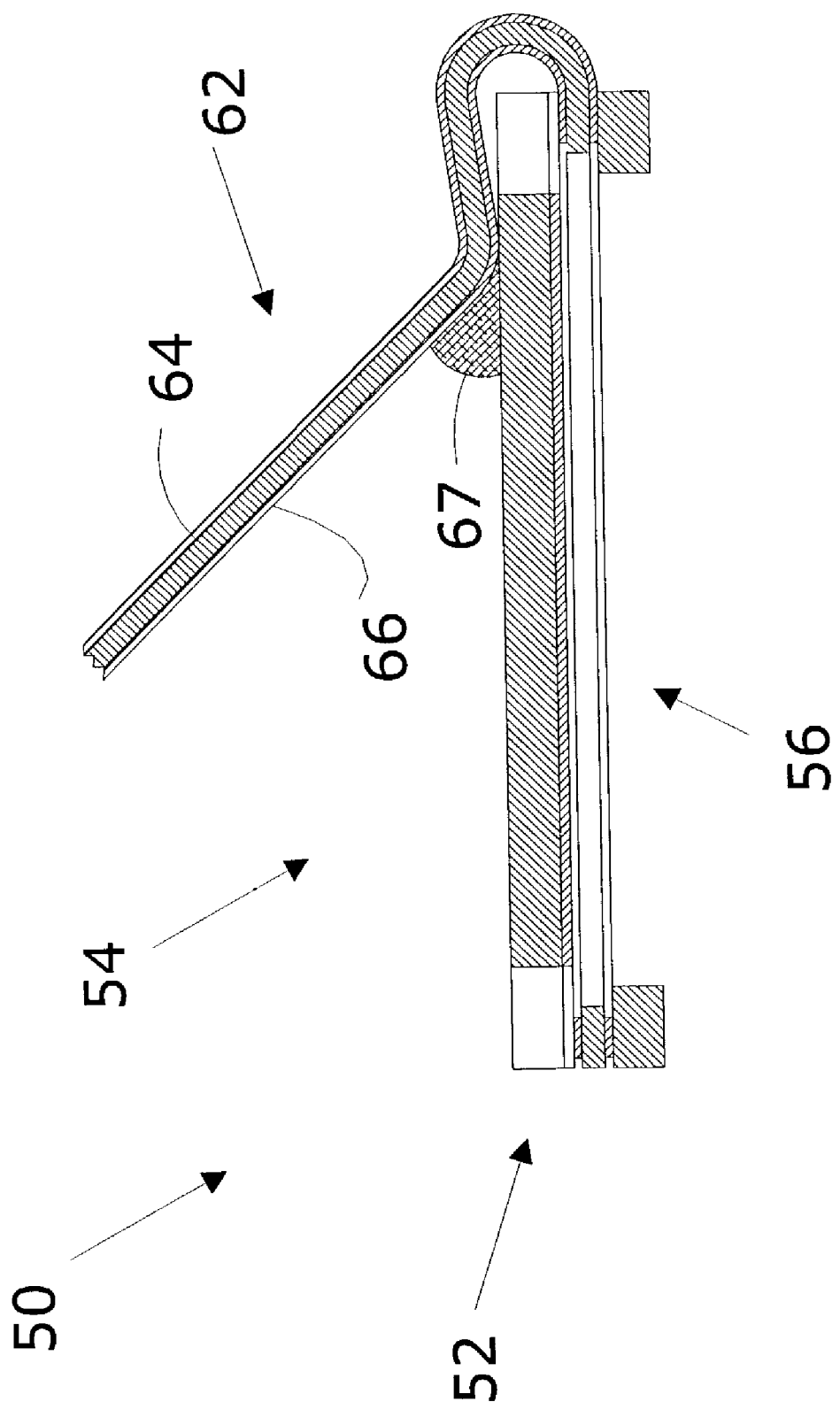

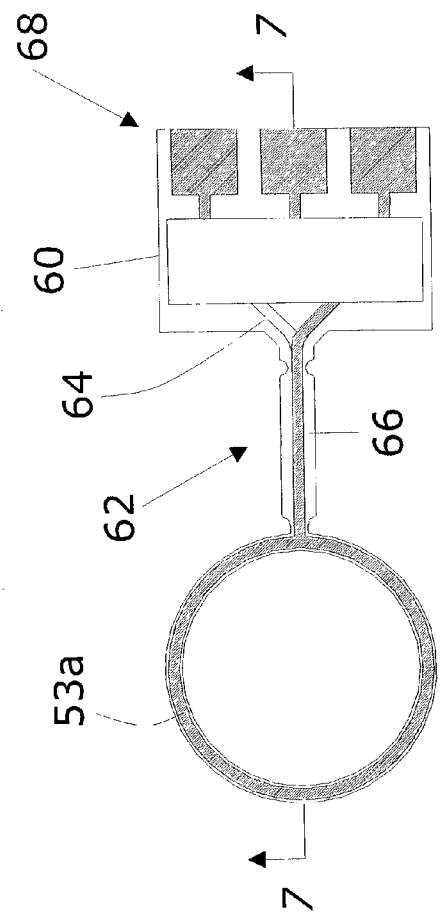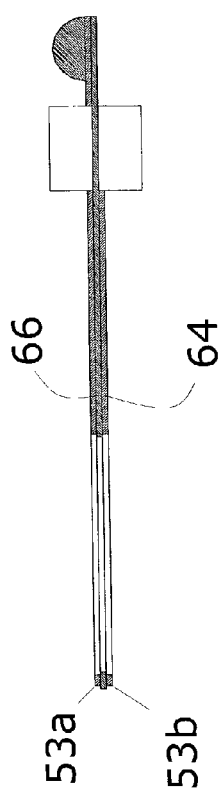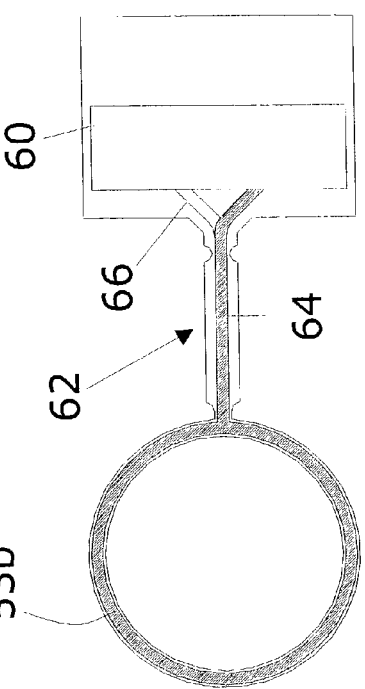
Fig. 6
Fig. 7
Fig. 8

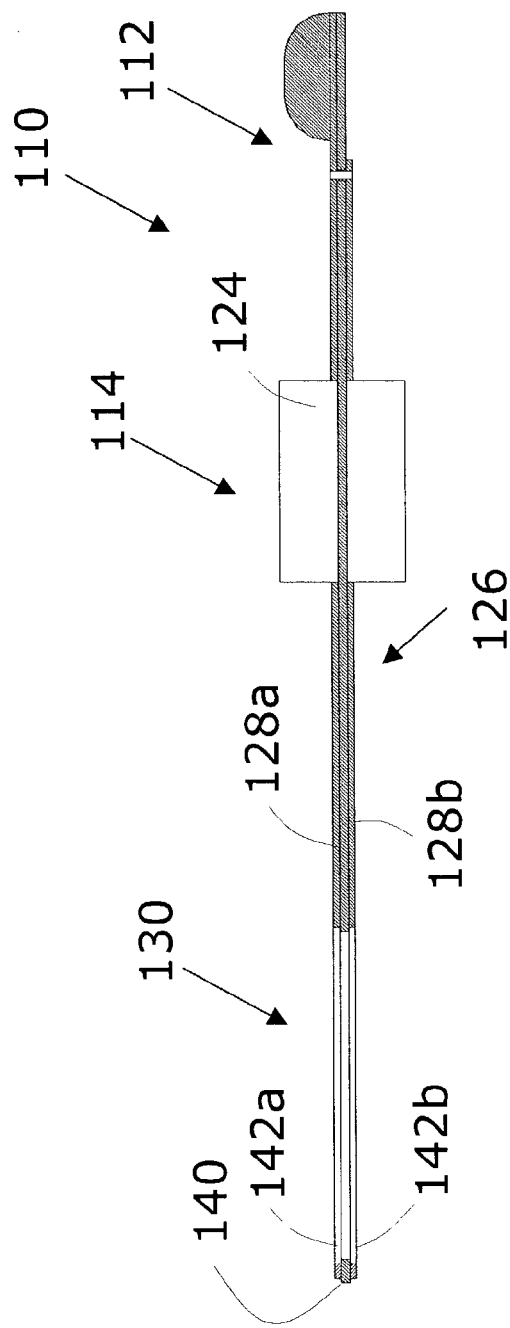
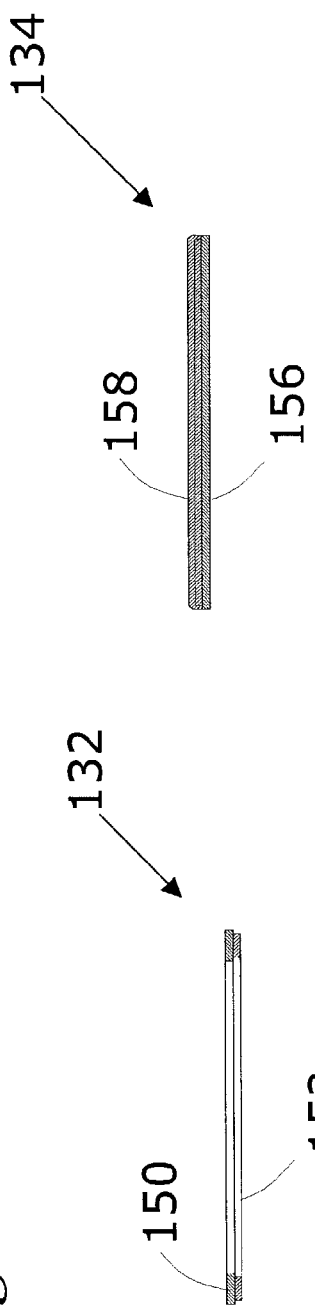
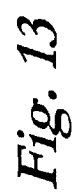
Fig. 11
Fig. 12
Fig. 13

MICROPHONE HAVING A FLEXIBLE PRINTED CIRCUIT BOARD FOR MOUNTING COMPONENTS

RELATED APPLICATION

This application claims the benefit of priority of U.S. Provisional Patent Application No. 60/327,806, filed Oct. 9, 2001.

FIELD OF THE INVENTION

This invention relates generally to electroacoustic transducers and, in particular, to an electroacoustic transducer having a flexible printed circuit board on which the internal components of the transducer are mounted.

BACKGROUND OF THE INVENTION

Electroacoustic transducers, which convert electrical energy into sound energy and vice versa, have been known for decades. They are useful for various purposes, including telecommunications equipment and hearing instruments, such as hearing aids (or generally "listening devices") that are located outside the ear or that fit within the ear canal. A conventional listening device includes a miniature microphone that receives acoustic waves and converts the acoustic waves to an audio signal. That audio signal is then processed (e.g, amplified) and sent to the receiver of the hearing aid or listening device The receiver then converts the processed signal to an acoustic signal that is broadcast towards the eardrum.

In addition to the size of the microphone becoming smaller, the amount of electronic equipment fitted with a microphone is rapidly growing. For many applications, including telecommunications equipment and hearing instruments, there is a demand for low cost, high performance miniature microphones.

The state-of-the-art transducer type used for these applications is the electret microphone. Generally, the construction of the electret microphone consists of three parts a microphone housing, an impedance conversion circuit, and the microphone cartridge. Such a cartridge typically consists of a rigid plate ("backplate") and a metallized polymer diaphragm separated by a thin spacer. The diaphragm and the backplate form the plates of a variable capacitor. A dielectric layer in either the backplate or diaphragm is permanently electrically charged ("electret"). An incoming sound wave causes the diaphragm to move relative to the backplate, resulting in a capacitance change. The change in capacitance alters the electrical field strength from the fixed charge and, thus, causes a voltage change across the capacitor.

Because the capacitance between the backplate and diaphragm is very small, the impedance of the electrical signal source is very high, and the signal is very sensitive to interference. Therefore, electret microphones typically include an internal buffer amplifier (or impedance conversion circuit). Both the backplate and the diaphragm of the cartridge must be connected with the buffer amplifier. Generally, either the backplate or the diaphragm ("reference") is connected with the amplifier via the microphone housing. The other ("signal") is connected with the amplifier by a wire, which requires the use of a soldering process and/or a small drop of electrically conductive adhesive. This is often a manual step subject to human error and is time consuming.

As such, a need exists for a new type of electroacoustic transducer that is easier to manufacture and requires less parts.

SUMMARY OF THE INVENTION

The present invention solves the aforementioned problems. In one embodiment, the present invention involves a novel method and structure in which a flexible printed circuit board ("flex-print") serves two functions: separating the diaphragm and backplate, and electrically connecting the cartridge and the buffer amplifier. Thus, the flex-print includes a spacer portion that maintains the appropriate distance between the diaphragm and the backplate, and an integral lead portion having an electrical conductor that serves as the signal path for transmitting the electrical signal from the cartridge to the buffer amplifier. The spacer portion has an electrical conductor that is electrically coupled to the diaphragm or backplate and the electrical conductor of the integral lead portion. Thus, the integral lead portion eliminates the need for soldering or gluing a lead wire between the two components.

The integral lead portion of the flex-print may optionally include a second electrical conductor that provides the reference path from the cartridge to the amplifier. When this embodiment is used, the microphone housing is not needed to provide the reference path to the buffer amplifier.

Further, the flex-print may also be used as the carrier for the buffer amplifier and its associated circuitry. In this embodiment, the flex-print includes another mounting section for the buffer amplifier and its associated circuitry. Thus, the integral lead portion has the spacer portion at one end and the amplifier mounting section on the other end. Generally, the buffer amplifier is a small integrated semiconductor circuit that is connected with the leads by bonding wires. Elements not integrated with the semiconductor, e.g., resistors and capacitors, can also be surface mounted on the flex-print by using SMD components. Alternatively, the flip-chip technology can be used for the buffer amplifier.

In a further embodiment, the flex-print may also be used as a portion of the diaphragm subassembly. The diaphragm is a metallized polymer film that is stretched in a ring-shaped or rectangular frame. While this frame can be made of a separate piece of flex-print, the frame can also be made from the same piece of flex-print that is used for the spacer and its integral lead portion. As such, the flex-print includes a region for mounting the diaphragm film that is eventually folded over the spacer portion of the flex-print.

A similar configuration can be made with respect to the backplate subassembly. The backplate subassembly includes a rigid plate with a conductive portion and a charged layer. The rigid plate can be made from flex-print material. Thus, the rigid plate can also be manufactured from the same piece of flex-print as was used for the spacer. A dielectric film can be laminated on top of the backplate to provide for storage of a permanent electrical charge.

In yet a further alternative of the invention, all of the components of the cartridge are manufactured and assembled on the same piece of flex-print. As such, the flex-print includes a region for mounting the moveable diaphragm. The backplate is located on another part of the flex-print. A spacer element is made from another part of the flex-print and maintains a certain spacing between the moveable diaphragm and the backplate after folding the flex-print. The spacer element has an internally conductive element(s) leading to and being in electrical contact with the backplate and/or the moveable diaphragm. The spacer element includes an integral lead portion made of the flex-print that includes a signal path for transmitting the electrical signal to the buffer amplifier, which can be located on yet another portion of the flex-print.

Because of the flexibility of the flex-print, the manufacturing process of the assembly can be performed while it is in a horizontal plane. After all of the components are attached to the flex-print, it can be folded or bent to a predetermined orientation so as to fit within a housing of a microphone or receiver.

The above summary of the present invention is not intended to represent each embodiment or every aspect of the present invention. This is the purpose of the Figures and the detailed description which follow.

BRIEF DESCRIPTION OF THE DRAWINGS

FIG. 1 is a cross-sectional view of a flexible printed circuit board with a single-side metallization layer in a first embodiment of the present invention.

FIG. 2 is a top view of the unfolded flexible printed circuit board of FIG. 1.

FIG. 3 is a cross-sectional view of the unfolded flexible printed circuit board taken along line 3—3 of FIG. 2

FIG. 4 is a cross-sectional view of a flexible printed circuit board with a single side metallization layer in a second embodiment of the present invention.

FIG. 5 is a cross-sectional view of a double-sided metallized flexible printed circuit board assembly illustrating a third embodiment of the present invention.

FIG. 6 is a top view of the unfolded flexible printed circuit board of FIG. 5.

FIG. 7 is a cross-sectional view of the unfolded flexible printed circuit board taken along line 7—7 of FIG. 6.

FIG. 8 is a bottom view of the unfolded flexible printed circuit board of FIG. 5.

FIG. 11 is a cross-sectional view of the unfolded flexible printed circuit board taken along line 11—11 of FIG. 10

FIG. 12 is a cross-sectional view of the diaphragm region taken along line 12—12 of FIG. 10.

FIG. 13 is a cross-sectional view of the charged plate region taken along line 13—13 of FIG. 10.

Figure 9:
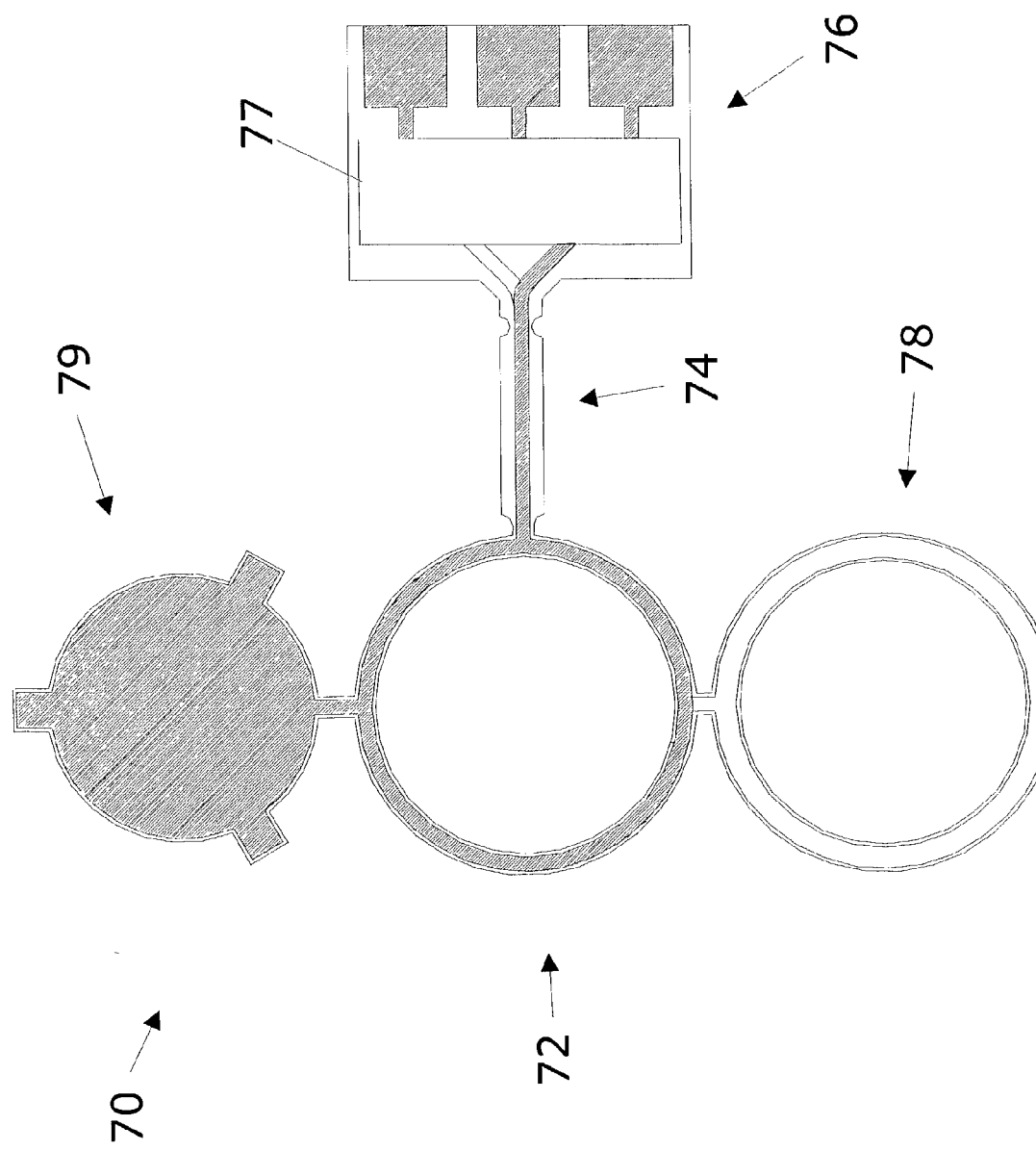
FIG. 9 is a top view of an unfolded printed circuit board assembly that, when folded, becomes a fully integrated microphone cartridge assembly according to another embodiment of the present invention.

While the invention is susceptible to various modifications and alternative forms, specific embodiments have been shown and by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DESCRIPTION OF ILLUSTRATIVE EMBODIMENTS

FIG. 1 illustrates a microphone cartridge 10 having a spacer subassembly 12 made of a flexible printed circuit board material, i.e., flex-print. The spacer subassembly 12, which has an annular shape spacing section 13, separates a diaphragm subassembly 14 from a backplate subassembly 16. The flex-print (e.g., polyimide) can have a thickness in the range of 25 to 50 microns, which is about the size of separation that is needed between the diaphragm subassembly 14 and the backplate subassembly 16. The diaphragm subassembly 14 includes a thin, moveable metallized (polymer) diaphragm 18 that is mounted on a frame 20. The backplate assembly 16 includes a rigid base layer 22 and a charged dielectric layer 24, which may be a TEFLON® fluoropolymer coating having a surface charge or a layer of special electret film ("EMFi"), such as one disclosed in U.S. Pat. Nos. 4,654,546 and 5,757,090 to Kirjavinen, both of which are incorporated herein by reference in their entireties. In essence, the spacer subassembly 12 maintains the appropriate spacing between the metallized diaphragm 18 and the charged layer 24 after the diaphragm subassembly 14 and the backplate subassembly 16 have been stacked on the spacer subassembly 12. The flex-print spacer subassembly 12 has an exposed, annular metal trace 26 (FIG. 2) on one side of the spacer subassembly 12 and a signal path 28 on an integral lead portion 29. The metal trace 26, which is connected to the signal path 28, is in electrical contact with the diaphragm 18.

FIGS. 2 and 3 show a top view and a cross-sectional view of the unfolded spacer subassembly 12, with the cross-section in FIG. 3 being taken along line 3—3 in FIG. 2. In addition, FIGS. 2 and 3 illustrate the connection of the integral lead portion 29 to a small circuit board, which is an amplifier portion 32 of the spacer subassembly 12. The signal path 28 of the integral lead portion 29 electrically transmits the electric signal from the diaphragm 18 to a buffer amplifier 30 on the amplifier portion 32. The backplate 16 provides the reference voltage and is connected with the reference terminal 36 of the buffer amplifier 30 via the metal housing of the microphone (not shown).

In the embodiment of FIGS. 1–3, the amplifier portion 32 of the spacer subassembly 12 has three output terminals 34 that transmit the output signal from the buffer amplifier 30 and provide the supply voltage. Thus, the amplifier portion 32 on which the buffer amplifier 30 is mounted is made from the same flex-print material as the spacing portion 13 and the integral lead portion 29 of the spacer subassembly 12. The integral lead portion 29 and its associated signal path 28, however, can terminate before the buffer amplifier 30. In this latter case, the integral lead portion 29 has a simple terminal at the end of the signal path 28 that can be used for connection to the buffer amplifier 30, which is mounted on a different structure.

FIG. 4 shows an alternative cartridge 10' where the positions of the diaphragm subassembly 14 and the backplate subassembly 16 have been swapped. The signal path 28 at a bend region 32 of the integral lead portion 29 (after it transitions from the flat shape of FIGS. 2 and 3 to the folded shape of FIG. 4) is held on the conductive base layer 22' of the backplate subassembly 16 by a drop of conductive adhesive 35 that makes an electrical connection with the base layer 22. The alternative of FIG. 4 with the conductive adhesive 35 is useful since the charged layer 24' is non conductive In the embodiment of FIGS. 5–8, a cartridge 50 includes a spacer subassembly 52 that is made of a flexible material, such as flex-print, having metal traces 53a, 53b on both sides of the annular spacing section. Thus, the double metallized configuration due to double traces 53a, 53b provides an electrical connection from both a backplate subassembly 54 and a diaphragm subassembly 56 to a buffer amplifier 60 (not shown in FIG. 5). Thus, an integral lead portion 62 has a first signal path 64 (bottom view in FIG. 8) on one of its sides and a second signal path 66 (top view of FIG. 6) on the other of its sides. The metal trace 66 makes contact with the backplate subassembly 54 through conductive adhesive 67. The metallization pattern of the amplifier region 68 of the spacer subassembly 52 provides all required connections for the semiconductor circuit. Additionally, passive components may be mounted on the amplifier region 68 of the spacer subassembly 52. The embodiment of FIGS. 5–8 alleviates the need to use metal housing to provide the reference connection between the cartridge 50 and the buffer amplifier 60 as was done by use of the reference terminal 36 in FIG. 2.

It should be further noted that use of the flex-print provides for the opportunity of passive or active shielding. Conductive layers or conductive wires can be on the same layer or adjacent layers as the signal paths. Thus, these paths can be shielded from exposure to electromagnetic energy and thereby provide a cleaner output signal.

Furthermore, the cartridges 10, 10', 50 can undergo electrical and acoustical testing at an earlier manufacturing stage. In fact, the cartridges 10, 10', 50 can be tested outside the microphone housing. Consequently, the yield of the final microphone assemblies is much higher since these cartridges 10, 10', 50 placed in the microphones are known to have a certain performance. Also, the testing allows two cartridges that have similar performances to be matched before assembly into a directional microphone composed of two matched cartridges.

The embodiments discussed thus far in FIGS. 1–8 have worked on the principle of the backplate being charged and the diaphragm including a thin metallization layer. The benefits achieved by this invention, however, also apply to electroacoustic transducers which utilize a simple metallized backplate in conjunction with a charged diaphragm. As an example, the diaphragm may be made from the EMFi material that was previously mentioned. This use of the flex-print for mounting components and separating components in a microphone is also applicable to non-electret type capacitive transducers While the illustrated embodiments are directed to electret microphones, the flex-print concept is also applicable for non-electret condenser microphones and for miniature electrostatic loudspeakers.

FIG. 9 illustrates an unfolded cartridge assembly 70 made of a flexible material, such as flex-print. The cartridge assembly 70 includes a spacer portion 72, an integral lead portion 74 having two signal paths, an amplifier portion 76 on which a buffer amplifier 77 (and its associate components) is mounted, a diaphragm mounting portion 78 (shown with a diaphragm thereon), and a backplate mounting portion 79. Thus, the cartridge assembly 70 is a backplate carrier and a diaphragm carrier, making it a fully integrated microphone component. During the production process, all parts are assembled on the unfolded cartridge assembly 70. The backplate mounting portion 79 and the diaphragm mounting portion 78 are then folded towards the spacer portion 72. The spacer portion 72 may include a single exposed metal trace for making contact with either the diaphragm or backplate, or two metal traces making contact with both the diaphragm and backplate. An embodiment similar to FIG. 9 is discussed in more detail below with respect to FIGS. 10–13. In particular, the folding processes that would be used with the cartridge assembly 70 are described in detail below.

Figure 10:
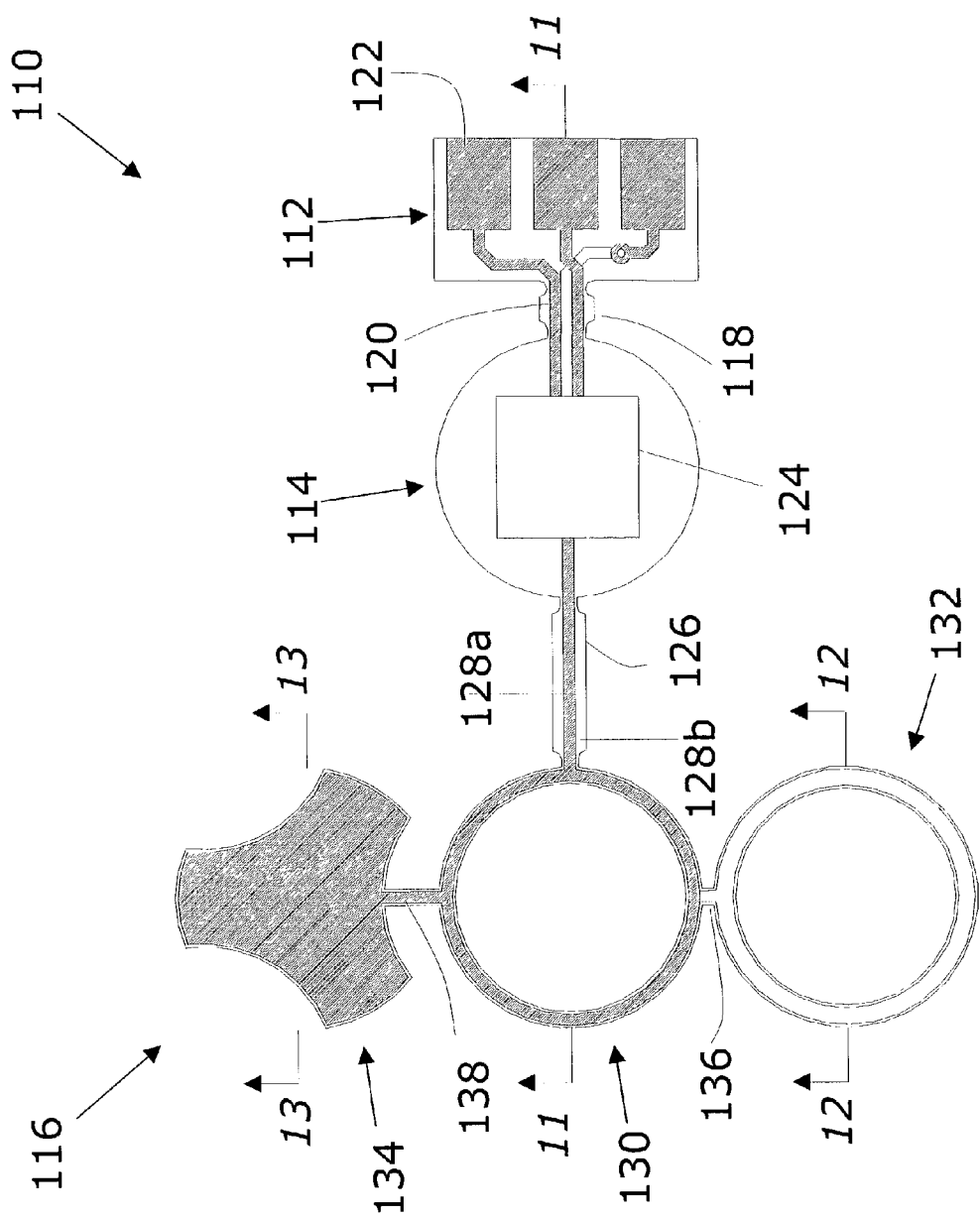
FIG. 10 is a top view of an unfolded printed circuit board assembly, similar to that of FIG. 9, incorporating another embodiment of the present invention.

Referring to FIG. 10, a fully integrated cartridge assembly 110 that is useful in a microphone (including directional microphones) is illustrated. The assembly 110 includes an output section 112, an amplifier mounting section 114, and a transducing section 116. The output section 112 and the amplifier mounting section 114 are attached to each other via a first connecting region 118. The first connecting region 118 serves as a conduit for output signal paths 120 that connect output terminals 122 to an integrated circuit 124 which, as shown in FIG. 10, is an amplifier. The amplifier mounting section 114 and the transducing section 116 are attached via a second connecting region 126. The second connecting region 126 also has a signal path 128 leading from the integrated circuit 124 to the transducing section 116. The signal paths 120, 128 can be made of gold, copper, or any other conductive material.

Simply stated, after assembly, the transducing section 116 receives sound and converts (i.e., transduces) the sound signal into a raw audio signal. The amplifier mounting section 114 receives the raw audio signal from the transducing section 116 and amplifies that signal. Finally, the amplified signal from the amplifier mounting section 114 is sent to the output section 112 where it can be communicated via the output terminals 122

The transducing section 116 has three distinct regions. A spacer region 130 is located in the central portion of the transducing section 116 Above the spacer region 130 is a diaphragm region 132, and below the spacer region 130 is a charged backplate region 134. The spacer region 130 is connected to the diaphragm region 132 via a first bridge 136. Likewise, the spacer region 130 is connected to the charged backplate region 134 via a second bridge 138. As shown, the assembly 110 of FIG. 10 is in an assembled form before any bending that ultimately results in the folded assembly, such as the one shown in FIG. 16.

The output section 112, the amplifier mounting section 114, and the transducing section 116 are preferably made of a flex-print constructed out of a flexible material, like polyimide. Such a construction allows for the passing of conductive leads within the material that define the output section 112, the amplifier mounting section 114, and the transducing section 116. Because it is thin and flexible, the assembly 110 can be folded or bent into a variety of shapes without disrupting the internally conductive elements within the material.

As mentioned above, the use of a flex-print provides for the opportunity of passive or active shielding. Conductive layers or conductive wires can be on the same layer or adjacent layers as the signal paths. Thus, these paths can be shielded from exposure to electromagnetic energy and thereby provide a cleaner output signal.

FIG. 11 is a cross-section of the annular spacer region 130, the amplifier mounting section 114, and the output section 112 taken along line 11—11 of FIG. 10. As can be seen, the second connecting region 126 and its associated signal paths 128a, 128b lead into a main body 140 of the spacer region 130. The main body 140 includes conductors 142a, 142b which extend entirely around the spacer region 130. The conductors 142a, 142b are attached to the signal paths 128a, 128b The conductors 142a, 142b may be gold, copper, or any other conductive material.

FIG. 12 is a cross-section of the diaphragm region 132 taken along line 12—12 of FIG. 10. The diaphragm region 132 includes an annular-shaped main body 150 with a thin film diaphragm 152 located thereabove. While the periphery of the diaphragm 152 is attached to the main body 150, a substantial portion of the diaphragm 152 is exposed in the open region of the annular-shaped main body 150 so that it can move when subjected to sound. In the illustrated embodiment, the diaphragm 152 is a flexible material like Mylar with a metallized surface for interacting with the charged plate in the charged backplate region 134.

FIG. 13 is a cross-section of the charged backplate region 134 taken along line 13—13 in FIG. 10. The charged backplate region 134 includes a main body 156 on which a charged layer 158 of material is placed. The charged layer 158 is located on the bottom of the main body 156. The material of the main body 134 is conductive, or may have a conductive layer. The charged layer 158 may be, for example, a TEFLON® fluoropolymer coating having a surface charge or a layer of electromagnetic film ("EMFi") previously mentioned. The charged backplate region 134 can be a simple coating that is placed on the structure of the flex-print as shown in FIG. 13. Alternatively, a separate structure having a charged surface can be placed onto a holding element within the charged backplate region 134 prior to the folding process.

During assembly, the main body 150 of the diaphragm region 132 receives the diaphragm 152. Once the diaphragm 152 is attached to the main body 150, the diaphragm region 132 can be folded over at the first bridge 136, such that the diaphragm 152 comes into contact with the upper surface 146 of the internal conductor 142 in the spacer region 130. Because the diaphragm 152 has a metallized upper layer, the diaphragm 152 is in electrical contact with one of the conductors 142a around the entire periphery of the main body 140 of the spacer region 130. Next, after receiving the coating or film to produce a charge, the charged backplate region 134 is folded under the spacer region 130, such that it comes into contact with the conductor 142b on the main body 140 of the spacer region 130. Consequently, the main body 140 of the spacer region 130 serves to maintain a known distance between the charged layer 158 and the diaphragm 152.

Figure 14:
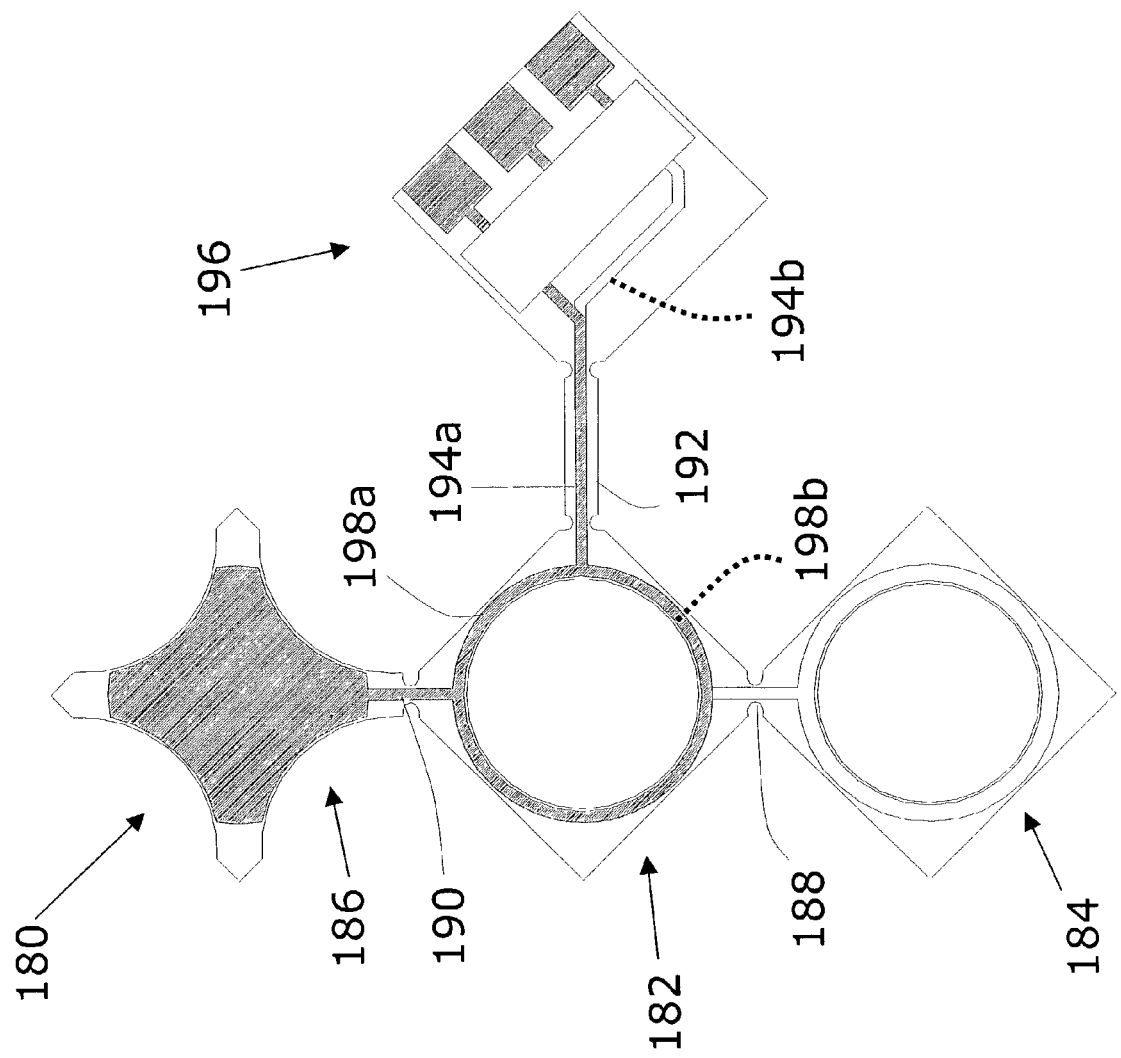
FIG. 14 is a top plan view of an alternative cartridge that has a rectangular-shaped outline.

FIG. 14 illustrates a transducing assembly 180 that, after being folded, will result in a cartridge that has a generally rectangular profile. The transducing assembly 180 includes a spacer region 182, a diaphragm region 184, and a charged backplate region 186. The spacer region 182 and the diaphragm region 184 are attached via a first bridge 188. Likewise, the spacer region 182 and the charged backplate region 186 are attached via a second bridge 190. The spacer region 182 has an extending portion 192 that contains electrical leads 194a, 194b on either side of the extending portion 192 leading to an amplifier region 196 The electrical leads 194a, 194b are in contact with conductors 198a, 198b in the main body of the spacer region 182. The conductors 198a, 198b extend entirely around the spacer region 182, such that they are in contact with the diaphragm of the diaphragm region 184 and the backplate when they are folded over onto the spacer region 182. As with the previous embodiment, the charged backplate region 186 folds over onto the underside of the spacer region 182.

Like the previous embodiment, the structure for the transducing assembly 180 is a flexible material, preferably flex-print. Again, all of the components can be assembled while the entire unfolded assembly 180 is horizontal The charged backplate region 186 receives a charged backplate and the diaphragm region 184 receives a diaphragm onto the flex-print. Alternatively, the charged plate is produced by applying a layer of charged material. Once the transducing assembly 180 has been properly folded, the transducing assembly 180 is a cartridge that is useful in any microphone or receiver. Although not ideal, the extending portion 192 could be removed and a gold lead wire could be soldered or glued to an exposed surface of the internal conductor 198. As with the previous embodiment, this embodiment eliminates the need for an additional lead wire that would normally be soldered or glued to the cartridge, as is the case in many prior art electroacoustic transducers. Further, the transducing assembly 180 is much easier to manufacture than the prior art devices since the assembly is horizontal as the components are being attached thereto and is simply folded to result in the final cartridge.

Figure 15:
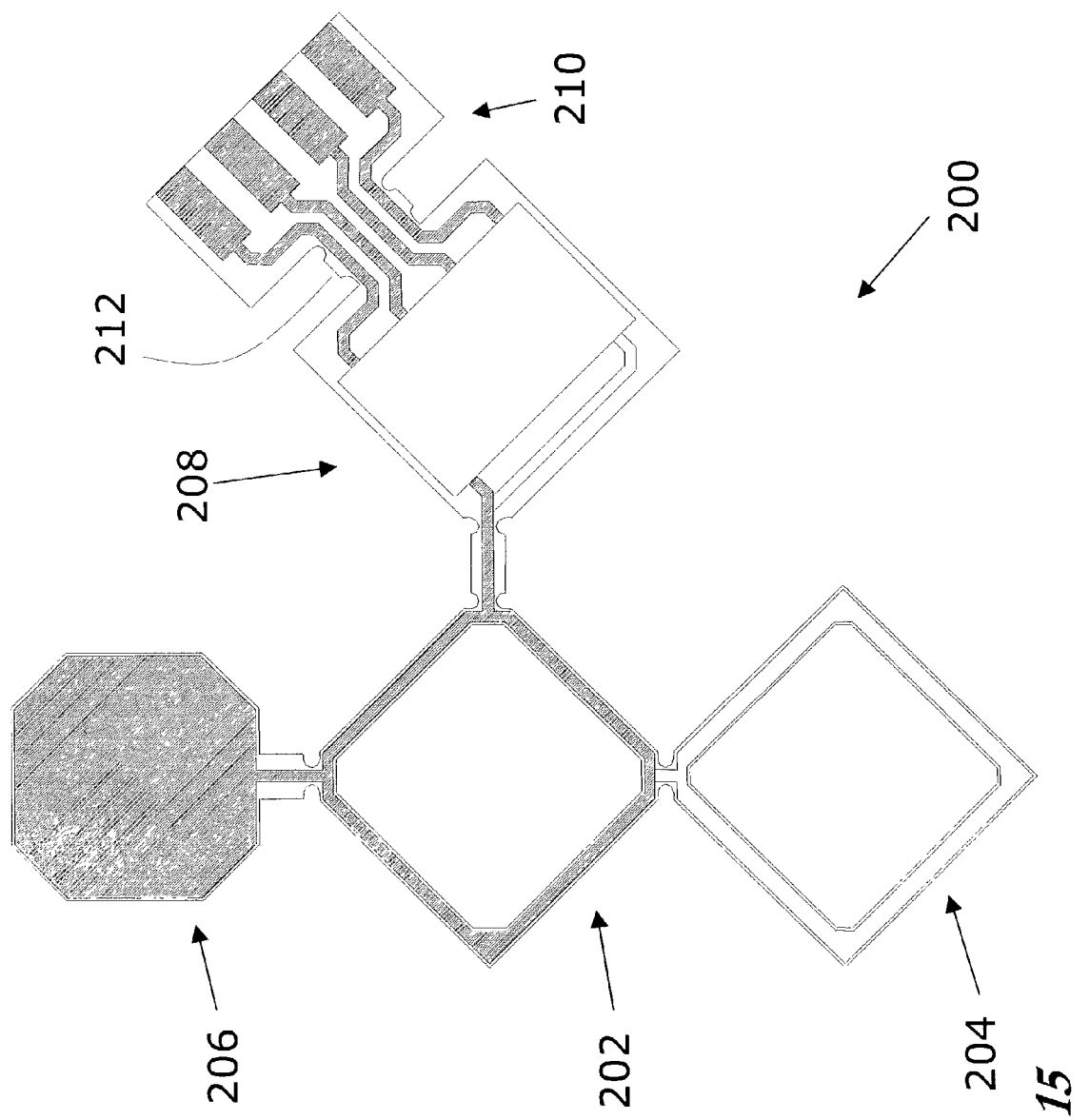
FIG. 15 is a top plan view of an alternative cartridge that has a rectangular-shaped outline and diaphragm.

FIG. 15 illustrates an alternative configuration that forms, when folded, another rectangular transducer 200, where the shape of the spacer region 202 and the diaphragm region 204 is rectangular. A backplate region 206 is substantially rectangular with the corners being truncated Also, the amplifier region 208 and the contact region 210 are connected by means of a bending region 212.

Figure 16:
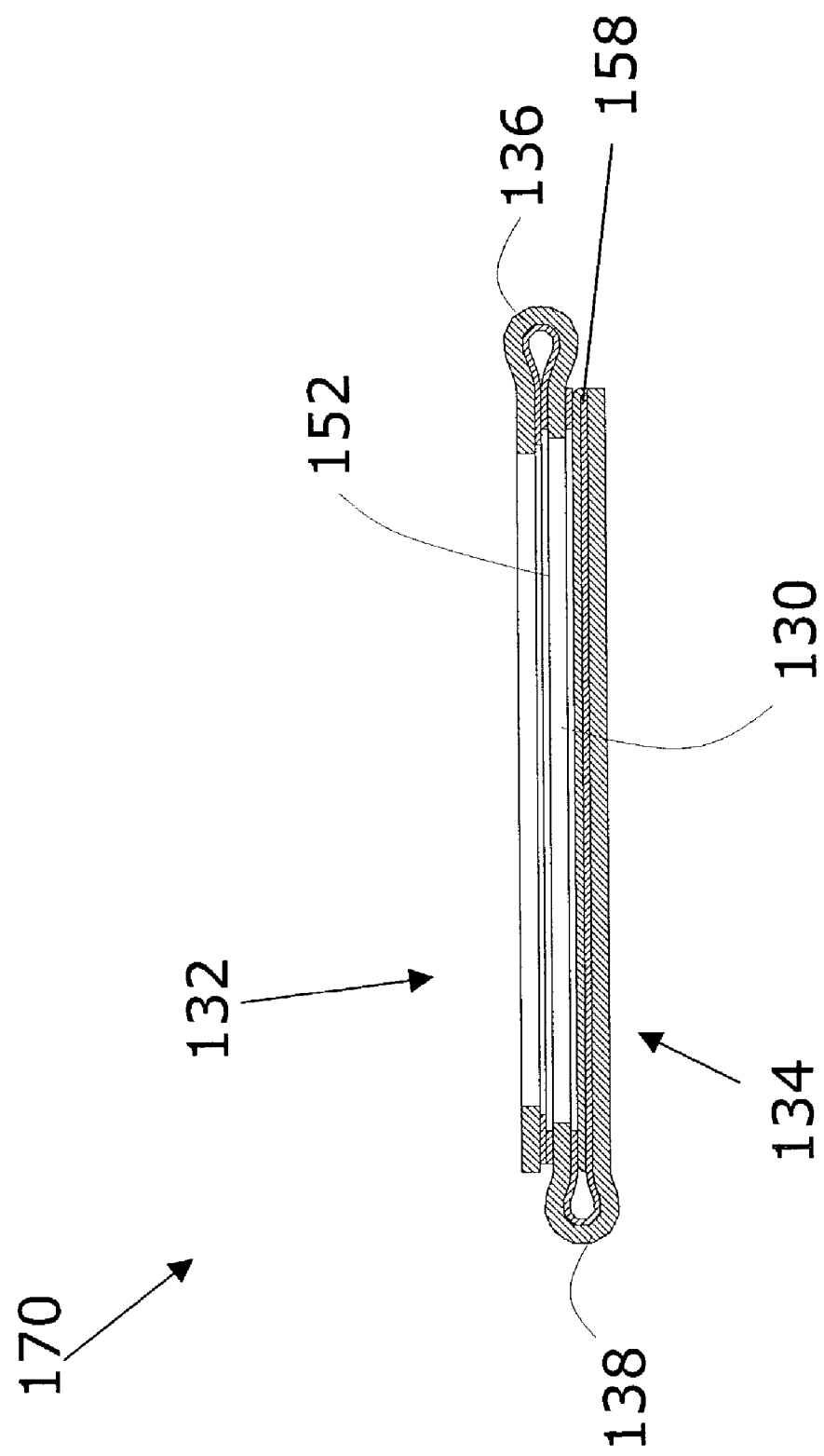
FIG. 16 is an assembly view of the cartridge of the present invention.

FIG. 16 illustrates a cross-section of the resultant assembly, the cartridge 170, after the transducing region 116 of FIGS. 10–13 has been folded The charged layer 158 of the backplate region 134 is directly exposed to the diaphragm 152 in the diaphragm region 132 through the opening of the annular-shaped spacer region 130 so that any movement of the diaphragm 152 relative to the charged layer 158 can be detected Once the folding process has been completed, the spacer region 130, the diaphragm region 132, and the charged backplate region 134 are secured to each other through a lamination process to develop the cartridge 170. Alternatively, the spacer region 130, the diaphragm region 132, and the charged backplate region 134 can be fixed in place through a clip or other type of fastener.

Figure 17:
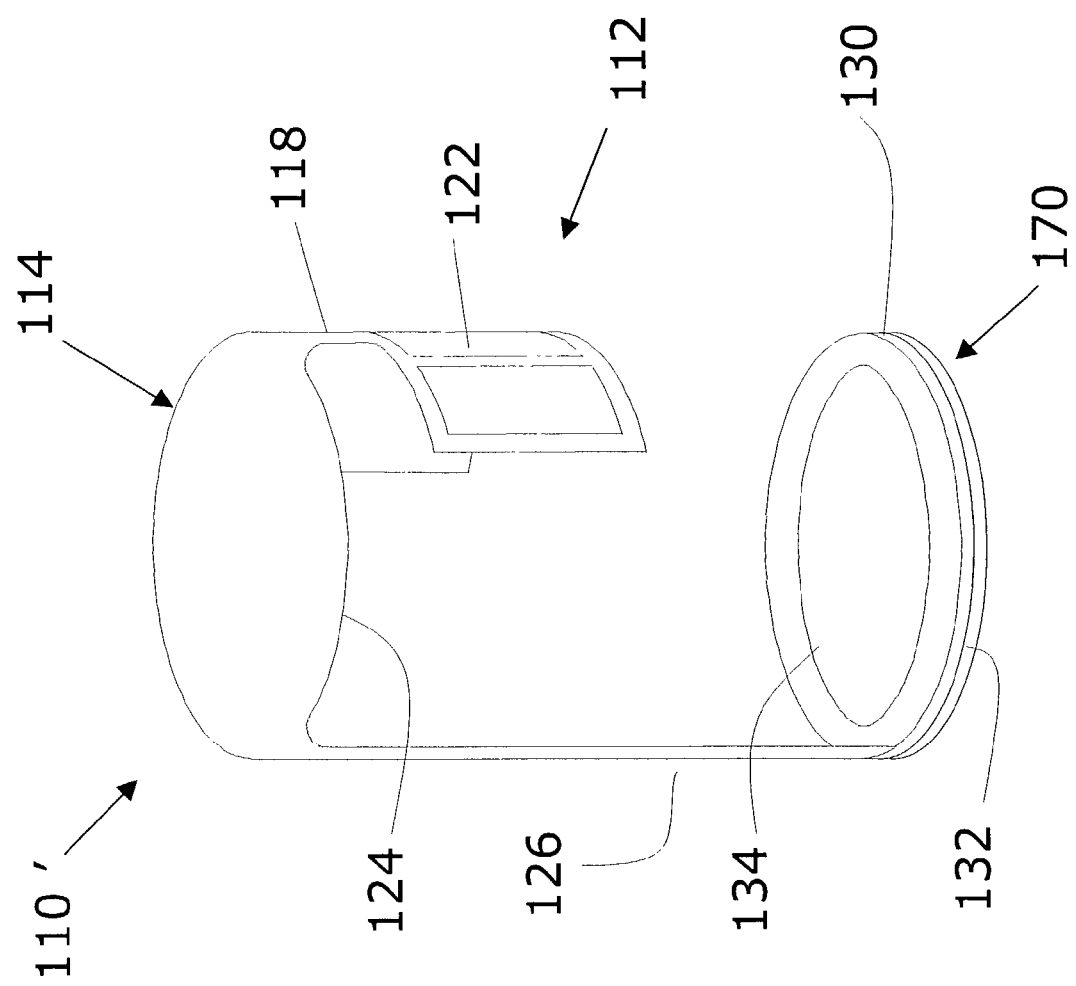
FIG. 17 is an isometric view of the present invention of FIG. 10 after full assembly such that its shape will accommodate its placement in a cylindrical microphone or receiver.

FIG. 17 illustrates the further bending process of the fully integrated cartridge assembly 110 of FIGS. 10–13 that results in an assembly 110' that is of a shape suitable for packaging in a cylindrical microphone or receiver. Here, the output section 112 has been folded, such that it now has a radius of curvature that is approximately the same as the radius of the periphery of the spacer region 130. The output terminals 122 can be located on either the inside or outside of the output section 112, but are preferably on the outside, as is shown in FIG. 11 The first connecting region 118 is bent or folded so that the curved plane in which the output section 112 now resides is generally perpendicular to the plane of the amplifier mounting section 114. The integrated circuit 124 is on the underside of the amplifier mounting section 114. The second connecting region 126 is folded twice. The first fold is located adjacent to the amplifier mounting section 114 and the second fold is located adjacent to the spacer region 130. Because of the double fold of the second connecting region 126, the resultant cartridge 170 is in a plane that is generally parallel to the plane in which the amplifier mounting section 114 resides.

Because the fully integrated cartridge assembly 110 of FIGS. 10–13 has been built upon a flex-print, the folding process is relatively easy and can be automated to produce the resultant cartridge 170 and the overall assembly 110' of FIG. 17. Because of the use of the flex-print, the devices can be made in high volume and with high repeatability, and the dimensions of each section or subassembly can be very small with tight tolerance Further, because the signal paths are buried within the flex-print material, it is very unlikely that there would be a breakage in those signal paths during the folding process. Compared with prior art transducers, there is also no need for a soldering or gluing process whereby the cartridge 170 is electrically connected to the integrated circuit 124 via a lead wire This also reduces the number of parts for manufacturing since the lead wire, the glue, and the soldering material are not needed Furthermore, as mentioned above, the assembly 110' can also undergo electrical testing at an earlier manufacturing stage, and cartridges having similar performances can be matched before assembly into a directional microphone.

Figure 18:
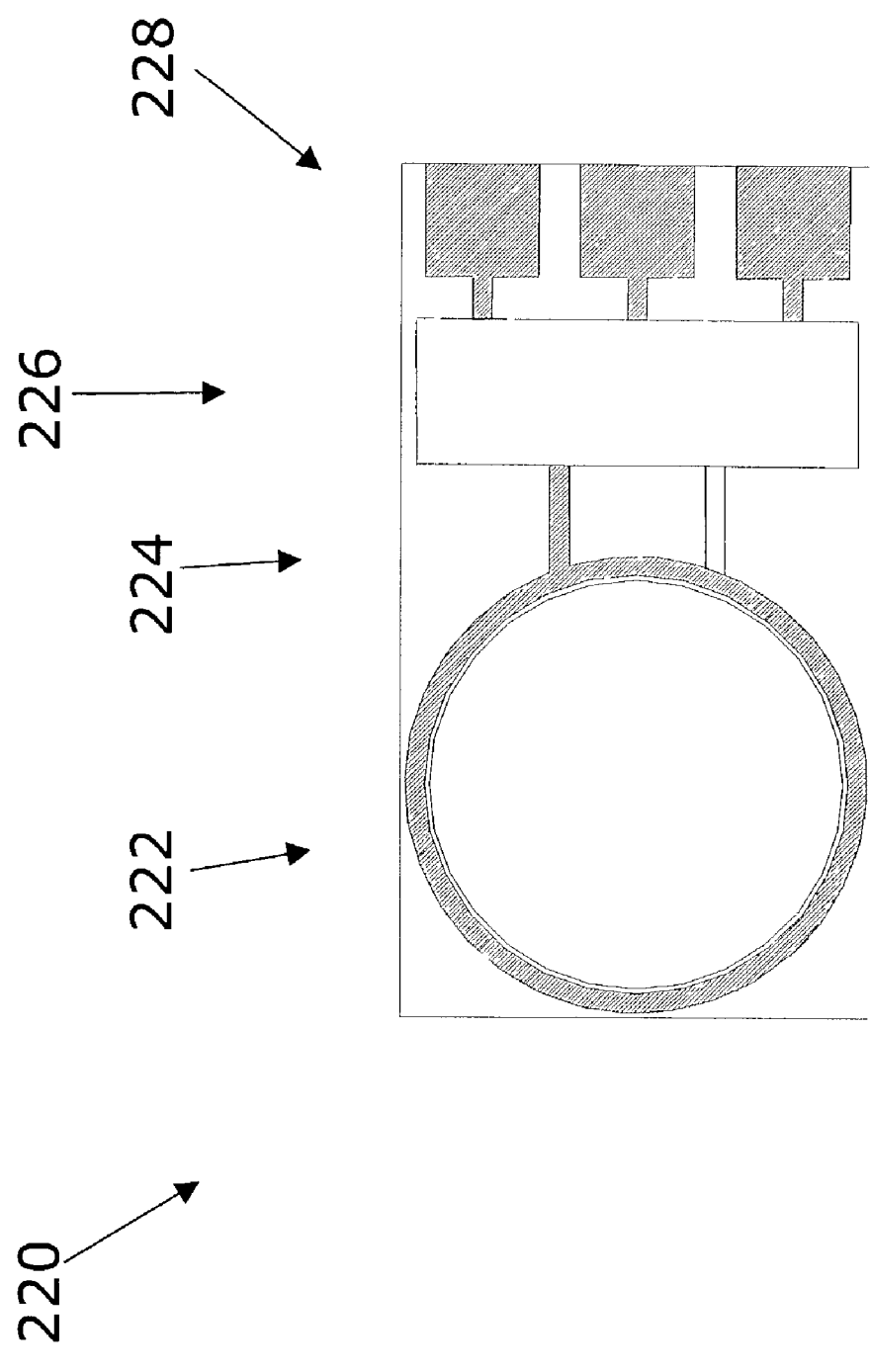
FIG. 18 is a top plan view of a flat flexible printed circuit board.

FIG. 18 illustrates a variant of the spacer subassembly 52 of FIGS. 5–8 where a spacer subassembly 220 has a spacer region 222, a lead region 224, an amplifier region 226, and a contact region 228 all in a single plane, which are not to be folded for assembly. After attachment of a backplate assembly and a diaphragm assembly, the entire transducer can be placed in a housing where the contact region 228 of the spacer subassembly 220 is exposed.

The embodiments discussed thus far in FIGS. 1–18 have worked on the principle of the backplate being charged and the diaphragm including a thin metallization layer The benefits achieved by this invention, however, also apply to electroacoustic transducers which utilize a simple metallized backplate in conjunction with a charged diaphragm. As an example, the diaphragm may be the EMFi material that was previously mentioned.

In each of the embodiments, as previously mentioned, a conductor within the spacer member can be configured such that it contacts the backplate, rather than the diaphragm (or vice versa). Further, embodiments having one signal path can have multiple signal paths between the spacer and the electronics that process the signals (or vice versa).

In an alternative embodiment of FIGS. 14 and 15 that is similar to FIGS. 1–8, the cartridge can be made of three separate layers that are stacked and bonded in the final processing steps. The first layer of the group is the backplate layer with the charged material (e.g., charged TEFLON® fluoropolymer). The second layer is the spacer with the connecting portion with the signal path leading to the amplifier. The third layer is the diaphragm support layer with the diaphragm mounted. Thus, the resultant flex-print would have multiple distinct layers. And, since the spacer is an electrical insulator, it may be possible to have the first and third layers be metal.

Furthermore, in addition to the flex-print providing a location for mounting circuitry that is specifically used by the microphone, circuitry that is used by other components of the listening device can be mounted on the flex-print. Thus, the flex-print serves as a platform for providing other hearing aid circuitry, such as signal processing.

While the present invention has been described with reference to one or more particular embodiments, those skilled in the art will recognize that many changes may be made thereto without departing from the spirit and scope of the present invention. Each of these embodiments and obvious variations thereof is contemplated as falling within the spirit and scope of the claimed invention, which is set forth in the following claims

What is claimed is:

1. A microphone subassembly, comprising:
   a moveable diaphragm;
   a backplate opposing said moveable diaphragm; and
   a spacer positioned between said diaphragm and said backplate, said spacer being made of a flexible printed circuit board material and including an exposed electrical trace for making electrical contact with one of said backplate and said diaphragm, said spacer including an integral lead portion for transmitting a signal from said one of said backplate and said diaphragm to another electrical component in the microphone.

2. The microphone subassembly of claim 1, wherein said another electrical component is an amplifier.

3. The microphone subassembly of claim 2, wherein said amplifier is mounted on an amplifier region of said flexible printed circuit board, said integral lead portion being between said amplifier region and said spacer.

4. The microphone subassembly of claim 1, wherein said exposed electrical trace makes contact with said diaphragm.

5. The microphone subassembly of claim 1, wherein said exposed electrical trace makes contact with said backplate.

6. The microphone subassembly of claim 1, wherein said flexible printed circuit board material has a thickness in the range of from about 25 to about 50 microns.

7. The microphone subassembly of claim 1, wherein said spacer has an annular shape.

8. The microphone subassembly of claim 7, wherein said annular shape has a rectangular periphery.

9. The microphone subassembly of claim 7, wherein said annular shape has a circular periphery.

10. The microphone subassembly of claim 7, wherein said exposed electrical trace is located completely around said annular shape.

11. The microphone subassembly of claim 1, wherein said diaphragm is mounted on a diaphragm carrier made of a printed circuit board material.

12. The microphone subassembly of claim 11, wherein said printed circuit board material of said diaphragm carrier is integral with said flexible printed circuit board material of said spacer, said diaphragm carrier being folded over onto said spacer during assembly.

13. The microphone subassembly of claim 1, wherein said backplate is comprised of at least a base layer and a charged layer, said base layer being made of a printed circuit board material.

14. The microphone subassembly of claim 13, wherein said printed circuit board material of said base layer is integral with said flexible printed circuit board material of said spacer, said base layer carrier being folded over onto said spacer during assembly.

15. The microphone subassembly of claim 1, wherein said integral lead portion has a terminal on its end.

16. The microphone subassembly of claim 1, wherein said subassembly is acoustically and electrically testable before assembly into a microphone housing.

17. A microphone subassembly, comprising:
   a moveable diaphragm;
   a backplate opposing said moveable diaphragm; and
   a flexible printed circuit board material having an annular portion between said diaphragm and said backplate, said flexible printed circuit board material having an integral lead portion extending away from said annular portion for transmitting a signal from one of said backplate and said diaphragm to another electrical component in said microphone.

18. The microphone subassembly of claim 17, wherein said annular portion has an exposed electrical trace for receiving said signal.

19. The microphone subassembly of claim 17, wherein said integral lead portion is connected to said backplate by conductive adhesive.

20. The microphone subassembly of claim 17, wherein said flexible printed circuit board material is a polyimide.

21. The microphone subassembly of claim 17, wherein said printed circuit board material includes an integral diaphragm carrier on which said carrier is mounted.

22. The microphone subassembly of claim 17, wherein said flexible printed circuit board material includes an integral base layer for said backplate, said backplate including a charged layer on said integral base layer.

23. A subassembly that converts sound into an output signal for use in an electroacoustic transducer, said subassembly comprising:
   a printed circuit board;
   a cartridge including a diaphragm that undergoes movement when exposed to said sound and a spacer separating said diaphragm from a backplate opposing said diaphragm, a portion of said cartridge being part of said printed circuit board, said spacer being a part of said printed circuit board, said cartridge producing an electrical signal corresponding to said movement; and
   an amplifier mounted on said printed circuit board for amplifying said electrical signal into said output signal.

24. The subassembly for the electroacoustic transducer of claim 23, wherein said printed circuit board includes a signal path leading from said cartridge to said amplifier, said signal path for transmitting said electrical signal.

25. The subassembly for the electroacoustic transducer of claim 23, wherein said printed circuit board includes a signal path leading from said cartridge to said amplifier.

26. The subassembly for the electroacoustic transducer of claim 25, wherein said spacer further has an internal conductor connected to said signal path, said internal conductor being in electrical contact with said diaphragm.

27. The subassembly for the electroacoustic transducer of claim 25, wherein said spacer further has an internal conductor connected to said signal path, said internal conductor being in electrical contact with said backplate.

28. The subassembly for the electroacoustic transducer of claim 23, wherein said backplate and said diaphragm are mounted on a portion of said printed circuit board.

29. The subassembly for the electroacoustic transducer of claim 28, wherein said spacer, said backplate, and said diaphragm are in a generally co-planer configuration, and said printed circuit board is folded into said cartridge during assembly to produce said co-planer configuration.

30. The subassembly for the electroacoustic transducer of claim 29, wherein said spacer, said backplate, and said diaphragm are configured to produce a generally circular profile to said cartridge after being folded.

31. The subassembly for the electroacoustic transducer of claim 29, wherein said spacer, said backplate, and said diaphragm are configured to produce a generally rectangular profile to said cartridge after being folded.

32. The subassembly for the electroacoustic transducer of claim 23, wherein said printed circuit board further includes a terminal section for transmitting said output signal.

33. The subassembly for the electroacoustic transducer of claim 23, wherein said printed circuit board has been folded so as to result in having surfaces in a plurality of planes.

34. The subassembly for the electroacoustic transducer of claim 23, wherein said transducer is a directional microphone.

35. The subassembly for the electroacoustic transducer of claim 23, wherein said cartridge further includes a spacer separating said diaphragm and a charged plate, said spacer being generally annular and being said portion of said cartridge that is said part of said printed circuit board.

36. A subassembly for use in an electroacoustic transducer for converting sound into an output signal, said subassembly comprising:
   a flexible printed circuit board for receiving a plurality of components of said transducer, said plurality of components including an amplifier, said flexible printed circuit board including a signal path between a transducing assembly that transduces said sound to an electrical signal and said amplifier that amplifies said electrical signal into said output signal, wherein said transducing assembly is a cartridge including a backplate, a movable diaphragm opposing said backplate, and a spacer between said backplate and said movable diaphragm, said spacer being a part of said flexible printed circuit board.

37. The subassembly for the electroacoustic transducer of claim 36, wherein said transducing assembly is received on said flexible printed circuit board.

38. The subassembly for the electroacoustic transducer of claim 36, wherein said microphone is a directional microphone.

39. An assembly for transducing sound into an electrical signal, comprising:
   a moveable diaphragm having a first surface;
   a backplate having a second surface generally opposing said first surface; and
   a spacer element for maintaining a certain spacing between said moveable diaphragm and said backplate, said spacer element being made of a printed circuit board material and having an internally conductive element leading to and being in electrical contact with at least one of said backplate and said moveable diaphragm.

40. The assembly of claim 39, wherein said backplate is a charged plate and said diaphragm has a metallized surface.

41. The assembly of claim 39, wherein said moveable diaphragm has a charged surface and said backplate is partially conductive.

42. The assembly of claim 39, wherein said conductive element is exposed at an upper surface of said spacer element and contacts said diaphragm adjacent to its periphery.

43. The assembly of claim 39, wherein at least portions of said spacer element, said backplate, and said diaphragm are part of a printed circuit board.

44. The assembly of claim 43, wherein said spacer element, said backplate, and said diaphragm are initially generally planar, and said printed circuit board is bent during manufacturing to result in said assembly.

45. The assembly of claim 43, wherein said spacer element, said backplate, and said diaphragm are laminated to each other.

46. The assembly of claim 43, wherein said spacer element has a generally annular shape.

47. The assembly of claim 46, wherein said generally annular shape is a generally rectangular annulus.

48. An electroacoustic transducer, comprising:
   a diaphragm subassembly and a backplate subassembly separated by a spacer having an integral conductive lead for transmitting signals from one or both of said diaphragm subassembly and said backplate subassembly, wherein said spacer is a printed circuit board and said integral conductive lead transmits signals to other electronic components on said printed circuit board, said diaphragm subassembly including a diaphragm and said backplate subassembly including a backplate.

49. The electroacoustic transducer of claim 48, wherein said printed circuit board includes a region adjacent to said spacer that serves as a mounting structure for said diaphragm.

50. The electroacoustic transducer of claim 48, wherein said backplate includes a charged dielectric layer.

51. The electroacoustic transducer of claim 50, wherein said backplate subassembly includes a rigid base layer opposing said charged dielectric layer.

52. The electroacoustic transducer of claim 48, wherein said spacer has a generally annular shape.

53. The electroacoustic transducer of claim 48, wherein said diaphragm subassembly includes a frame to which said diaphragm is mounted.

54. An electroacoustic transducer, comprising:

a diaphragm subassembly and a backplate subassembly separated by a printed circuit board having an integral conductive lead for transmitting signals from one or both of said diaphragm subassembly and said backplate subassembly, said diaphragm subassembly including a diaphragm and said backplate subassembly including a backplate, said integral conductive lead transmitting signals to other electronic components on said printed circuit board.

* * * * *